(12) United States Patent
Li

(10) Patent No.: US 12,183,423 B2
(45) Date of Patent: Dec. 31, 2024

(54) INPUT BUFFER CIRCUIT AND SEMICONDUCTOR MEMORY

(71) Applicant: CHANGXIN MEMORY TECHNOLOGIES, INC., Hefei (CN)

(72) Inventor: Siman Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 189 days.

(21) Appl. No.: 17/953,329

(22) Filed: Sep. 27, 2022

(65) Prior Publication Data

US 2023/0017747 A1 Jan. 19, 2023

Related U.S. Application Data

(63) Continuation of application No. PCT/CN2022/096907, filed on Jun. 2, 2022.

(30) Foreign Application Priority Data

Jul. 5, 2021 (CN) .......................... 202110758787.8

(51) Int. Cl.
| | |
|---|---|
| G11C 7/10 | (2006.01) |
| G11C 11/4093 | (2006.01) |
| G11C 11/4096 | (2006.01) |
| H03K 19/0185 | (2006.01) |

(52) U.S. Cl.
CPC ........ *G11C 7/1084* (2013.01); *G11C 11/4093* (2013.01); *G11C 11/4096* (2013.01); *H03K 19/018507* (2013.01)

(58) Field of Classification Search
CPC .............. G11C 7/1084; G11C 11/4093; G11C 11/4096; H03K 19/018507
See application file for complete search history.

(56) References Cited

U.S. PATENT DOCUMENTS

| | | | |
|---|---|---|---|
| 6,373,297 B1* | 4/2002 | Lee .................. | H03K 19/01707 327/108 |
| 10,411,707 B1 | 9/2019 | Lee | |
| 2002/0005758 A1* | 1/2002 | Iga ...................... | H03F 3/45766 330/257 |

(Continued)

FOREIGN PATENT DOCUMENTS

| | | | | |
|---|---|---|---|---|
| CN | 101800550 A | * | 8/2010 | |
| CN | 107005246 A | * | 8/2017 | ............. G11C 27/02 |

(Continued)

*Primary Examiner* — Mushfique Siddique
(74) *Attorney, Agent, or Firm* — Kilpatrick Townsend & Stockton LLP

(57) ABSTRACT

Embodiments provide an input buffer circuit and a semiconductor memory, a compensation subcircuit is provided between an input terminal of the input buffer circuit and a first terminal of a load subcircuit, a current of an output terminal of the input buffer circuit is increased, and voltage variation of the input terminal can be transmitted to the output terminal in time, such that the output terminal can timely receive the voltage variation of the input terminal, thereby avoiding distortion of an output signal, solving a problem of signal attenuation for the input buffer circuit, improving sensitivity of the input buffer circuit, and preventing negative effects from being caused to transmission of commands inside a system.

11 Claims, 5 Drawing Sheets

(56) References Cited

U.S. PATENT DOCUMENTS

2006/0001448 A1* 1/2006 Seo ................ H03K 19/018528
                                                          326/80
2011/0204930 A1* 8/2011 Agarwal .............. G11C 27/024
                                                          327/111

FOREIGN PATENT DOCUMENTS

| CN | 112615618 A | * | 4/2021 | ............. | G05F 1/465 |
| JP | 2005341582 A | * | 12/2005 | ........... | H03L 7/0814 |

* cited by examiner

--Prior Art--

--Prior Art--

INPUT BUFFER CIRCUIT AND SEMICONDUCTOR MEMORY

CROSS-REFERENCE TO RELATED APPLICATION

This application is a continuation of PCT/CN2022/096907, filed on Jun. 2, 2022, which claims priority to Chinese Patent Application No. 202110758787.8, titled "INPUT BUFFER CIRCUIT AND SEMICONDUCTOR MEMORY" and filed on Jul. 5, 2021, the entire contents of which are incorporated herein by reference.

TECHNICAL FIELD

The present disclosure relates to the field of electronic circuits, and more particularly, to an input buffer circuit and a semiconductor memory.

BACKGROUND

As an indispensable basic subcircuit in an integrated circuit, an input buffer circuit may be configured to perform voltage detection on a threshold voltage to determine whether a voltage of an input signal is higher or lower than the threshold voltage. An input buffer comprising CMOS-based logic devices is generally configured to receive high or low voltage signals from outside, and then provide a logic state corresponding to the high or low voltage signal. When the voltage of the input signal is higher than the threshold voltage, an output logic level signal is changed from a first level signal to a second level signal; and when the voltage of the input signal is lower than the threshold voltage, the output logic level signal is changed from the second level signal to the first level signal. When the voltage of the input signal is higher than the threshold voltage, the output logic level signal is changed from the second level signal to the first level signal; and when the voltage of the input signal is lower than the threshold voltage, the output logic level signal is changed from the first level signal to the second level signal. The first level signal is a low-level signal and the second level signal is a high-level signal.

FIG. 1 is a circuit diagram of an existing input buffer module. Referring to FIG. 1, a first input terminal Input of the input buffer module 10 is configured to receives an input signal, a second input terminal ref of the input buffer module 10 is configured to receive a reference signal, and an output terminal Output of the input buffer module 10 is configured to output an output signal, which is inputted to an internal circuit 11. When the voltage of the input signal is higher than a voltage (the threshold voltage) of the reference signal, the logic level signal of the output signal from the output terminal Output is changed from the first level signal to the second level signal; and when the voltage of the input signal is lower than the voltage of the reference signal, the logic level signal of the output signal from the output terminal Output is changed from the second level signal to the first level signal. When the voltage of the input signal is higher than the voltage (the threshold voltage) of the reference signal, the logic level signal of the output signal from the output terminal Output is changed from the second level signal to the first level signal; and when the voltage of the input signal is lower than the voltage of the reference signal, the logic level signal of the output signal from the output terminal Output is changed from the first level signal to the second level signal. In this way, identification and compari- son of the input signal are achieved, where the first level signal is a low-level signal, and the second level signal is a high-level signal.

However, the existing input buffer module has poorer sensitivity, and thus cannot meet requirements.

FIG. 2 is a circuit diagram of an input buffer circuit according to a first embodiment of the present disclosure. Referring to FIG. 2, the input buffer circuit includes a first NMOS transistor N1, a second NMOS transistor N2, a first PMOS transistor P1, and a second PMOS transistor P2.

A gate of the first NMOS transistor N1 is electrically connected to an input terminal Input, a source of the first NMOS transistor N1 is electrically connected to a current source Bias, and a drain of the first NMOS transistor N1 is electrically connected to an output terminal Output. A gate of the second NMOS transistor N2 is electrically connected to a reference voltage Vref, and a source of the second NMOS transistor N2 is electrically connected to the current source Bias. A gate of the first PMOS transistor P1 is electrically connected to a drain of the second NMOS transistor N2, a source of the first PMOS transistor P1 is electrically connected to an external power supply voltage, and a drain of the first PMOS transistor P1 is electrically connected to the output terminal Output. A gate and a drain of the second PMOS transistor P2 are both electrically connected to the drain of the second NMOS transistor N2, and a source of the second PMOS transistor P2 is electrically connected to the external power supply voltage. The input terminal Input is configured to receive an input signal, and the output terminal Output is configured to output an output signal to an internal circuit. A voltage signal inputted from the input terminal Input of the input buffer circuit is compared with the reference voltage Vref. The output terminal outputs a low-level signal when the voltage inputted from the input terminal Input is greater than the reference voltage, and the output terminal outputs a high-level signal when the voltage inputted from the input terminal Input is smaller than the reference voltage. In this way, transmission of the voltage signal to the internal circuit is implemented.

In actual operation, when a signal from the output terminal of the input buffer circuit is distorted, a signal received by the internal circuit is distorted, such that negative effects may be caused to transmission of commands inside a system.

SUMMARY

A technical problem to be solved by the present disclosure is to compensate for signal attenuation of the input buffer circuit and improve sensitivity of the input buffer circuit by providing an input buffer circuit and a semiconductor memory.

To solve the above problem, the present disclosure provides an input buffer circuit, including an input terminal, an output terminal, a reference terminal, and an input buffer unit. The input terminal is configured to receive an input signal, the output terminal is configured to output an output signal, the reference terminal is configured to receive a reference signal, and the input buffer unit includes:

an input subcircuit comprising a first input terminal, a second input terminal, a first output terminal, a second output terminal and a control terminal, the first input terminal being used as the input terminal of the input buffer circuit, and the second input terminal being used as the reference terminal of the input buffer circuit;

a load subcircuit comprising a first terminal, a second terminal and a control terminal, the first terminal being electrically connected to the first output terminal of the input subcircuit and being used as the output terminal of the input buffer circuit, the second terminal being electrically connected to the second output terminal of the input subcircuit, and the control terminal being electrically connected to a first external voltage;

a current source subcircuit electrically connected to the control terminal of the input subcircuit and a second external voltage respectively, the current source subcircuit being configured to provide a reference current to the input buffer circuit; and a compensation subcircuit comprising a first terminal and a second terminal, the first terminal of the compensation subcircuit being electrically connected to the first input terminal of the input subcircuit, the second terminal of the compensation subcircuit being electrically connected to the second terminal of the load subcircuit, and the compensation subcircuit being configured to transmit a voltage variation of the input signal to the load subcircuit to enlarge a magnitude of an effective output current of the input buffer circuit.

The present disclosure also provides a semiconductor memory, which includes the above-mentioned input buffer circuit.

In the present disclosure, a compensation subcircuit is provided between the input terminal of the input buffer circuit and the first terminal of the load subcircuit, a current of the output terminal of the input buffer circuit is increased, and voltage variation of the input terminal can be transmitted to the output terminal in time, such that the output terminal can timely receive the voltage variation of the input terminal, thereby avoiding distortion of an output signal, solving the problem of signal attenuation for the input buffer circuit, improving the sensitivity of the input buffer circuit, and preventing negative effects from being caused to transmission of commands inside a system.

DETAILED DESCRIPTION

Implementations of an input buffer circuit and a semiconductor memory provided by the present disclosure will be described in detail below with reference to the accompanying drawings.

Based on long-term study and analysis, it is found that reasons for distortion of the output signal from the output terminal of the input buffer circuit are as below. When a CPU sends a command, the signal may be attenuated through a channel, especially for a high-frequency signal. So when the signal is transmitted to the input terminal of the input buffer circuit, voltage amplitude of the signal has been reduced. However, when the input voltage from the input terminal Input of the input buffer circuit is only slightly greater than the reference voltage, the input buffer circuit cannot recognize a signal of voltage difference between the input voltage of the input terminal Input and the reference voltage, voltage variation of the input terminal cannot be transmitted to the output terminal, such that the output terminal cannot timely receive the voltage variation of the input terminal, thereby causing distortion of the output signal, and thus cannot meet requirements.

Therefore, the present disclosure provides an input buffer circuit, which can transmit the voltage variation of the input terminal Input to the output terminal in time, such that the output terminal can receive the voltage variation of the input terminal in time, thereby avoiding distortion of the output signal and improving sensitivity of the input buffer circuit.

Figure 3:
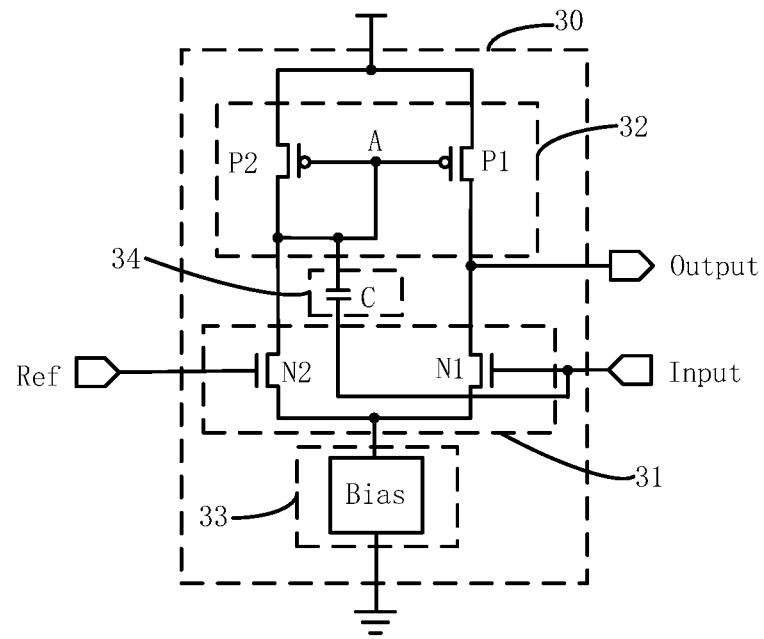
FIG. 3 is a circuit diagram of an input buffer circuit according to a second embodiment of the present disclosure.

FIG. 3 is a circuit diagram of an input buffer circuit according to a second embodiment of the present disclosure. Referring to FIG. 3, the input buffer circuit includes an input terminal Input, an output terminal Output, a reference terminal Ref, and an input buffer unit 30.

The input terminal Input is configured to receive an input signal. A command sent from a CPU to the internal circuit is used as the input signal from the input terminal Input. The output terminal Output is electrically connected to the internal circuit to output an output signal. The output signal outputted from the output terminal Output is used as the input signal from the internal circuit, to achieve transmission of the command inside the system. The reference terminal Ref is configured to receive a reference signal. The reference signal serves as the threshold voltage of the input buffer circuit.

The input buffer unit 30 includes an input subcircuit 31, a load subcircuit 32, a current source subcircuit 33, and a compensation subcircuit 34.

The input subcircuit 31 includes a first input terminal, a second input terminal, a first output terminal, a second output terminal, and a control terminal. As the input terminal Input of the input buffer circuit, the first input terminal is configured to receive the input signal. As the reference terminal Ref of the input buffer circuit, the second input terminal is configured to receive the reference signal. The first output terminal is electrically connected to a first terminal of the load subcircuit 32, to jointly serve as the output terminal Output of the input buffer circuit. The second output terminal is electrically connected to a second terminal of the load subcircuit 32, and is configured to provide a signal to the load subcircuit 32. The control terminal is electrically connected to the current source subcircuit 33.

Further, in this embodiment, the input subcircuit includes a first NMOS transistor N1 and a second NMOS transistor N2. A gate of the first NMOS transistor N1 is used as the first input terminal of the input subcircuit 31. That is, the gate of the first NMOS transistor N1 is electrically connected to the input terminal Input of the input buffer circuit. A drain of the first NMOS transistor N1 is used as the first output terminal of the input subcircuit 31. That is, the drain of the first NMOS transistor N1 is electrically connected to the output terminal Output of the input buffer circuit. A source of the first NMOS transistor N1 is used as the control terminal of the input subcircuit 31. That is, the source of the first NMOS transistor N1 is electrically connected to the current source subcircuit 33. A gate of the second NMOS transistor N2 is used as the second input terminal of the input subcircuit 31. That is, the gate of the second NMOS transistor N2 is electrically connected to the reference terminal Ref of the input buffer circuit. A drain of the second NMOS transistor N2 is used as the second output terminal of the input subcircuit 31. That is, the drain of the second NMOS transistor N2 is electrically connected to the second terminal of the load subcircuit 32. A source of the second NMOS transistor N2 is electrically connected to the source of the first NMOS transistor N1. That is, the source of the second NMOS transistor N2 is electrically connected to the current source subcircuit 33. A reference current is provided to the first NMOS transistor N1 and the second NMOS transistor N2 by the same current source subcircuit 33, which facilitates to control and maintain signal stability.

In the second embodiment, the input subcircuit 31 comprises two NMOS transistors. However, in other embodiments of the present disclosure, the input subcircuit 31 may also comprise two PMOS transistors, or the input subcircuit 31 comprises a plurality of NMOS transistors or PMOS transistors to implement the same control logic configuration, which should be considered as an acceptable technical solution.

With continued reference to FIG. 3, the load subcircuit 32 includes a first terminal, a second terminal, and a control terminal. The first terminal is electrically connected to the first output terminal of the input subcircuit 31, and is used as the output terminal Output of the input buffer circuit. The second terminal is electrically connected to the second output terminal of the input subcircuit 31, and is configured to receive a signal outputted from the second output terminal of the input subcircuit 31. The control terminal is electrically connected to a first external voltage, which is configured to provide a power supply voltage.

Further, in this embodiment, the load subcircuit 32 includes a first PMOS transistor P1 and a second PMOS transistor P2. A gate of the first PMOS transistor P1 is used as the second terminal of the load subcircuit 32 and is electrically connected to the second output terminal of the input subcircuit 31 to receive a signal outputted from the second output terminal of the input subcircuit 31. As the first terminal of the load subcircuit 32, a drain of the first PMOS transistor P1 is electrically connected to the first output terminal of the input subcircuit 31, and is used as the output terminal Output of the input buffer circuit. A source of the first PMOS transistor P1 is used as the control terminal of the load subcircuit 32 and is electrically connected to the first external voltage. A gate and a drain of the second PMOS transistor P2 are both electrically connected to the gate of the first PMOS transistor P1, and a source of the second PMOS transistor P2 is electrically connected to the source of the first PMOS transistor P1.

In the second embodiment, the load subcircuit 32 comprises PMOS transistors. However, in other embodiments of the present disclosure, the load subcircuit 32 may also comprise NMOS transistors, or the load subcircuit 32 comprises a plurality of NMOS transistors or PMOS transistors to implement the same control logic configuration, which should be considered as acceptable technical solutions.

With continued reference to FIG. 3, the current source subcircuit 33 is electrically connected to the control terminal of the input subcircuit 31 and the second external voltage respectively, to provide the reference current to the input buffer circuit. In this embodiment, the first external voltage is a power supply voltage, and the second external power supply is a grounding voltage.

With continued reference to FIG. 3, the compensation subcircuit 34 includes a first terminal and a second terminal. The first terminal of the compensation subcircuit 34 is electrically connected to the first input terminal of the input subcircuit 31, and the second terminal of the compensation subcircuit 34 is electrically connected to the second terminal of the load subcircuit 32. The compensation subcircuit 34 is configured to transmit a voltage variation of the input signal to the load subcircuit 32 to enlarge a magnitude of an effective output current of the input buffer circuit.

In this embodiment, the compensation subcircuit 34 includes a capacitor C, and in other embodiments, the compensation subcircuit 34 may include a combination of a plurality of capacitors, to implement the same control logic configuration, which should be considered as acceptable technical solutions.

In the present disclosure, the compensation subcircuit 34 is provided between the input terminal of the input buffer circuit and the second terminal of the load subcircuit 32, and the compensation subcircuit 34 can timely transmit the voltage variation of the input terminal Input to the second terminal of the load subcircuit 32, thereby improving the sensitivity of the input buffer circuit.

Meanwhile, due to the existence of the compensation subcircuit 34, an output current of the output terminal Output is also increased, thereby avoiding distortion of the output signal from the output terminal Output, and a concrete description is as follows.

Figure 1:
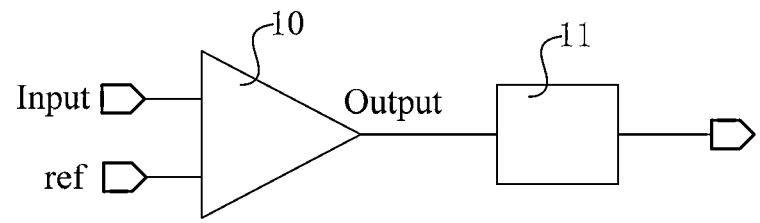
FIG. 1 is a circuit diagram of an existing input buffer module.
Figure 2:
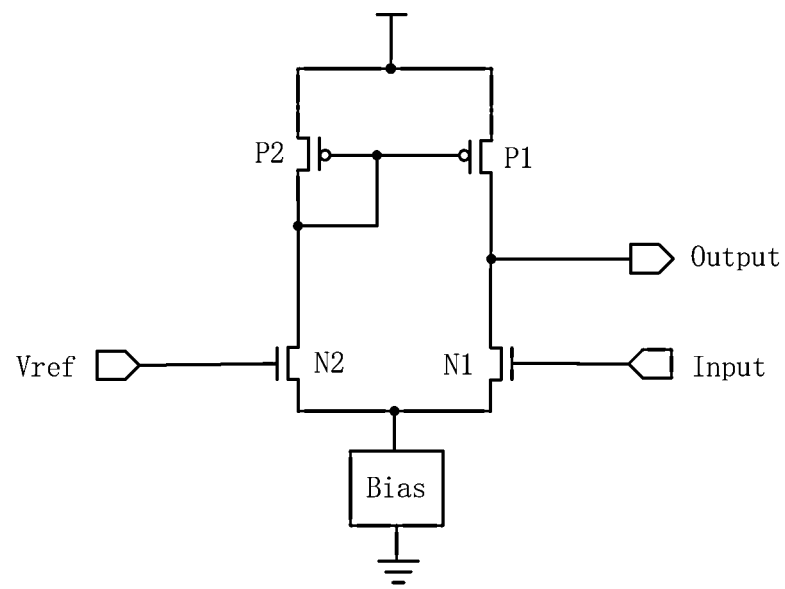
FIG. 2 is a circuit diagram of an existing input buffer circuit according to a first embodiment of the present disclosure.

As shown in FIG. 2, when the compensation subcircuit 34 is not provided, an input voltage of the input terminal Input is $\Delta Vin1$, and a converted current thereof on the first NMOS transistor N1 is $I1=gm1*\Delta Vin1$, where gm1 represents transconductance of the first NMOS transistor N1, and the output current from the output terminal Output is $Iout=I1$.

After the compensation subcircuit 34 is provided, as shown in FIG. 3, the input voltage of the input terminal Input is still $\Delta Vin1$, and the converted current thereof on the first NMOS transistor N1 is $I1=gm1*\Delta Vin1$. Under a coupling action of the capacitor C, a voltage generated at Point A (i.e., the gate of the first PMOS transistor P1) is $\Delta Vin2$, and a current converted by the first PMOS transistor P1 is $I2=gm2*\Delta Vin2$, where gm2 represents transconductance of the first PMOS transistor P1, the output current from the output terminal Output is $Iout=I1+I2=gm1*\Delta Vin1+gm2*\Delta Vin2=gm1*(\Delta Vin1')$, and $\Delta Vin1'$ represents a final equivalent input range.

As can be seen, compared with the case where the compensation subcircuit 34 is not provided, the final equivalent input range of the input buffer circuit increases, and the output current Iout of the output terminal Output increases. When the input voltage of the input terminal Input of the input buffer circuit is only slightly greater than the reference voltage, the input buffer circuit can recognize a signal of voltage difference between the input voltage of the input terminal Input and the reference voltage, voltage variation of the input terminal is transmitted to the output terminal in time, such that the output terminal can timely receive the voltage variation of the input terminal, thereby avoiding distortion of the output signal, solving the problem of signal attenuation for the input buffer circuit, improving the sensitivity of the input buffer circuit, and preventing negative effects from being caused to transmission of commands inside the system.

The present disclosure also provides a third embodiment, and a connection relationship between the subcircuits in the third embodiment is the same as that of the second embodiment. The third embodiment is different from the second embodiment in that the input subcircuit 31 comprises PMOS transistors and the load subcircuit 32 comprises NMOS transistors, and concrete description is as follows.

Figure 4:
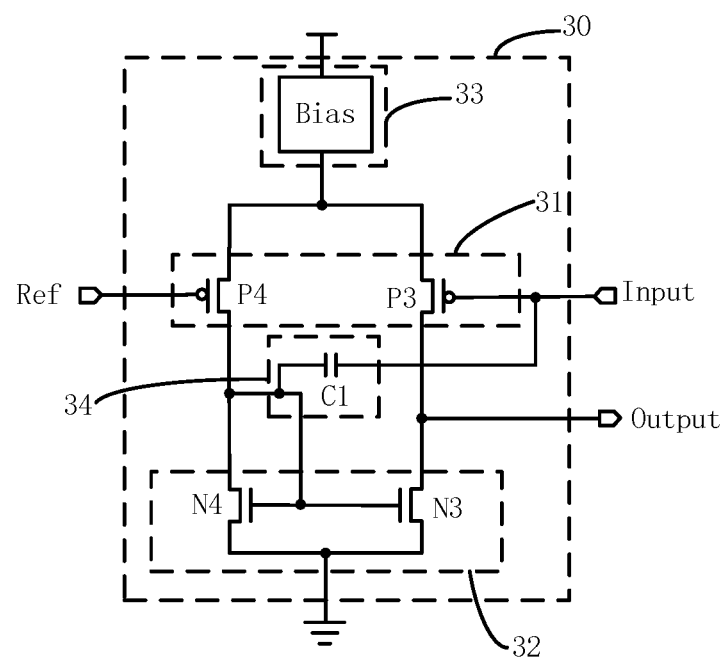
FIG. 4 is a circuit diagram of an input buffer circuit according to a third embodiment of the present disclosure.

FIG. 4 is a circuit diagram of an input buffer circuit according to the third embodiment of the present disclosure. Referring to FIG. 4, the input subcircuit 31 includes a third PMOS transistor P3 and a fourth PMOS transistor P4. A gate of the third PMOS transistor P3 is used as the first input terminal of the input subcircuit 31. That is, the gate of the third PMOS transistor P3 is electrically connected to the input terminal Input of the input buffer circuit. A drain of the third PMOS transistor P3 is used as the first output terminal of the input subcircuit. That is, the drain of the third PMOS transistor P3 is electrically connected to the output terminal Output of the input buffer circuit. A source of the third PMOS transistor P3 is used as the control terminal of the input subcircuit. That is, the source of the third PMOS transistor P3 is electrically connected to the current source subcircuit 33. A gate of the fourth PMOS transistor P4 is used as the second input terminal of the input subcircuit. That is, the gate of the fourth PMOS transistor P4 is electrically connected to the reference terminal Ref of the input buffer circuit. A drain of the fourth PMOS transistor P4 is used as the second output terminal of the input subcircuit. That is, the drain of the fourth PMOS transistor P4 is electrically connected to the second terminal of the load subcircuit 32. A source of the fourth PMOS transistor P4 is electrically connected to the source of the third PMOS transistor P3. That is, the source of the fourth PMOS transistor P4 is electrically connected to the current source subcircuit 33. A reference current is provided to the third PMOS transistor P3 and the fourth PMOS transistor P4 by the same current source subcircuit 33, which facilitates to control and maintain signal stability.

The load subcircuit 32 includes a third NMOS transistor N3 and a fourth NMOS transistor N4. A gate of the third NMOS transistor N3 is used as the second terminal of the load subcircuit 32 and is electrically connected to the second output terminal of the input subcircuit 31 to receive the output signal from the second output terminal of the input subcircuit 31. As the first terminal of the load subcircuit, a drain of the third NMOS transistor N3 is electrically connected to the first output terminal of the input subcircuit 31 and is used as the output terminal Output of the input buffer circuit. A source of the third NMOS transistor N3 is used as the control terminal of the load subcircuit and is electrically connected to the first external voltage. A gate and a drain of the fourth NMOS transistor N4 are both electrically connected to the gate of the third NMOS transistor N3, and a source of the fourth NMOS transistor N4 is electrically connected to the source of the third NMOS transistor N3.

In this embodiment, the first external voltage is a grounding voltage, and the second external voltage is a power supply voltage.

Figure 5:
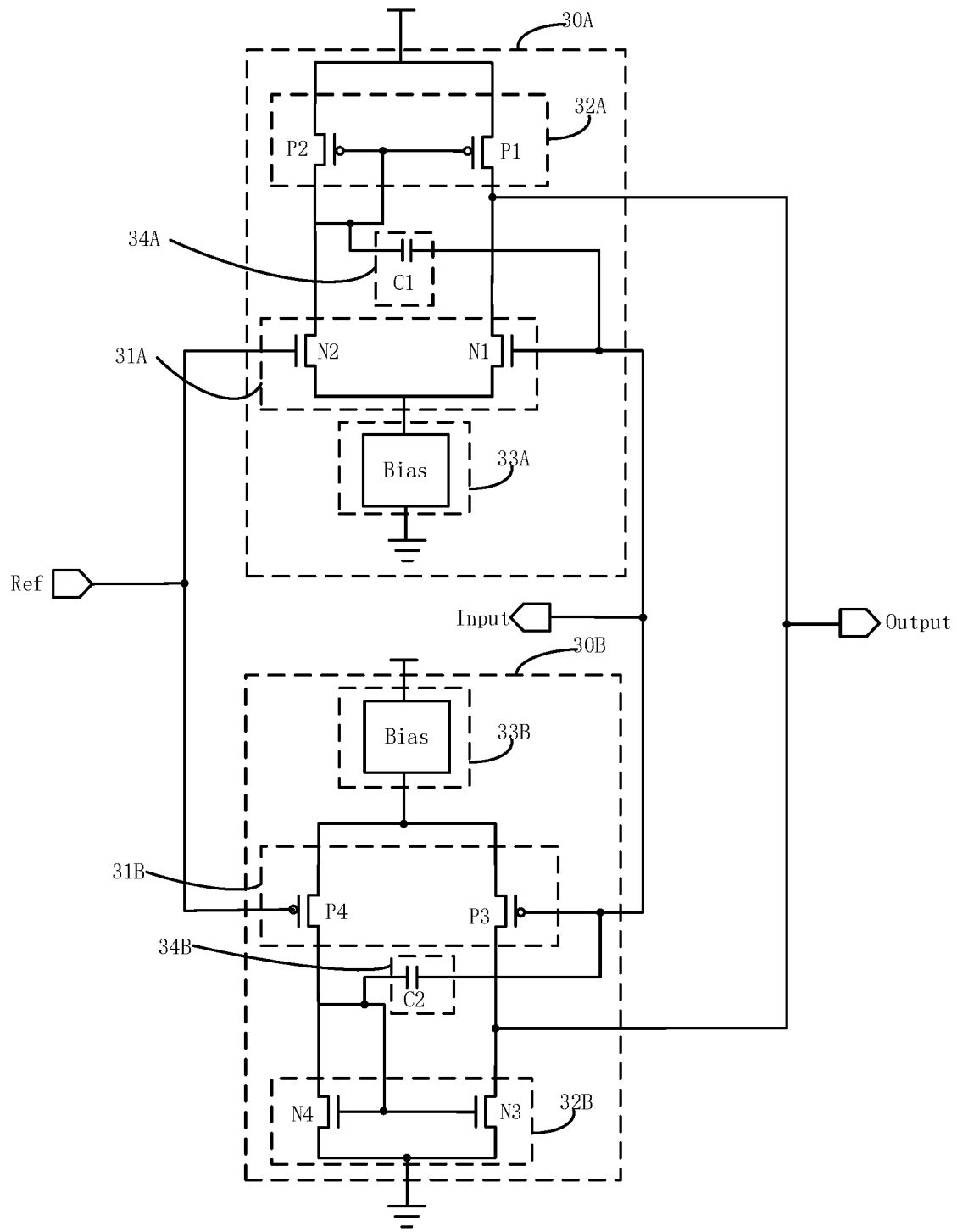
FIG. 5 is a circuit diagram of an input buffer circuit according to a fourth embodiment of the present disclosure.

In the second embodiment and the third embodiment, the input buffer circuit only includes one of the input buffer units 30. However, in other embodiments of the present disclosure, the input buffer circuit includes a plurality of input buffer units 30. For example, FIG. 5 is a circuit diagram of an input buffer circuit according to a fourth embodiment of the present disclosure. Referring to FIG. 5, in the fourth embodiment of the present disclosure, the input buffer circuit includes two input buffer units, which are respectively denoted as a first input buffer unit 30A and a second input buffer unit 30B, where the first input buffer unit 30A and the second input buffer unit 30B are arranged in parallel. That is, the input terminal of the input buffer circuit provides the input signal to the first input buffer unit 30A and the second input buffer unit 30B, the reference terminal of the input buffer circuit provides the reference signal to the first input buffer unit 30A and the second input buffer unit 30B, and the first input buffer unit 30A and the second input buffer unit 30B jointly provide the output signal of the input buffer circuit.

A structure of the first input buffer unit 30A is the same as that of the input buffer unit provided by the second embodiment of the present disclosure, and a structure of the second input buffer unit 30B is the same as that of the input buffer unit provided by the third embodiment of the present disclosure.

In some embodiments, the first input buffer unit 30A includes a first input subcircuit 31A, a first load subcircuit 32A, a first current source subcircuit 33A, and a first compensation subcircuit 34A.

The first input subcircuit 31A includes a first NMOS transistor N1 and a second NMOS transistor N2. A gate of the first NMOS transistor N1 is used as the first input terminal of the first input subcircuit 31A. That is, the gate of the first NMOS transistor N1 is electrically connected to the input terminal Input of the input buffer circuit. A drain of the first NMOS transistor N1 is used as the first output terminal of the first input subcircuit 31A. That is, the drain of the first NMOS transistor N1 is electrically connected to the output terminal Output of the input buffer circuit. A source of the first NMOS transistor N1 is used as the control terminal of the first input subcircuit 31A. That is, the source of the first NMOS transistor N1 is electrically connected to the first current source subcircuit 33A. A gate of the second NMOS transistor N2 is used as the second input terminal of the first input subcircuit 31A. That is, the gate of the second NMOS transistor N2 is electrically connected to the reference terminal Ref of the input buffer circuit. A drain of the second NMOS transistor N2 is used as the second output terminal of the first input subcircuit 31A. That is, the drain of the second NMOS transistor N2 is electrically connected to the second terminal of the first load subcircuit 32A. A source of the second NMOS transistor N2 is electrically connected to the source of the first NMOS transistor N1. That is, the source of the second NMOS transistor N2 is electrically connected to the first current source subcircuit 33A.

The first load subcircuit 32A includes a first PMOS transistor P1 and a second PMOS transistor P2. A gate of the first PMOS transistor P1 is used as the second terminal of the first load subcircuit 32A, and is electrically connected to the second output terminal of the first input subcircuit 31A to receive the output signal from the second output terminal of the first input subcircuit 31A. As the first terminal of the first load subcircuit 32A, a drain of the first PMOS transistor P1 is electrically connected to the first output terminal of the first input subcircuit 31A, and is used as the output terminal Output of the input buffer circuit. A source of the first PMOS transistor P1 is used as the control terminal of the first load subcircuit 32A, and is electrically connected to the first external voltage. A gate and a drain of the second PMOS transistor P2 are both electrically connected to the gate of the first PMOS transistor P1, and a source of the second PMOS transistor P2 is electrically connected to the source of the first PMOS transistor P1.

The first current source subcircuit 33A is electrically connected to the control terminal of the first input subcircuit 31A and the second external voltage respectively, and is configured to provide the reference current to the first input buffer unit 30A. In this embodiment, the first external voltage is a power supply voltage, and the second external power supply is a grounding voltage.

The first compensation subcircuit 34A includes a first terminal and a second terminal. The first terminal of the first compensation subcircuit 34A is electrically connected to the first input terminal of the first input subcircuit 31A, and the second terminal of the first compensation subcircuit 34A is electrically connected to the second terminal of the first load subcircuit 32A. The first compensation subcircuit 34A is configured to transmit the voltage variation of the input signal of the input terminal to the first load subcircuit 32A, to enlarge the amplitude of the effective output current of the input buffer circuit. In this embodiment, the first load subcircuit 34A includes a first capacitor C1.

The second input buffer unit 30B includes a second input subcircuit 31B, a second load subcircuit 32B, a second current source subcircuit 33B, and a second compensation subcircuit 34B.

The second input subcircuit 31B includes a third PMOS transistor P3 and a fourth PMOS transistor P4. A gate of the third PMOS transistor P3 is used as the first input terminal of the second input subcircuit 31B. That is, the gate of the third PMOS transistor P3 is electrically connected to the input terminal Input of the input buffer circuit. A drain of the third PMOS transistor P3 is used as the first output terminal of the second input subcircuit 31B. That is, the drain of the third PMOS transistor P3 is electrically connected to the output terminal Output of the input buffer circuit. A source of the third PMOS transistor P3 is used as the control terminal of the second input subcircuit 31B. That is, the source of the third PMOS transistor P3 is electrically connected to the second current source subcircuit 33B. A gate of the fourth PMOS transistor P4 is used as the second input terminal of the second input subcircuit 31B. That is, the gate of the fourth PMOS transistor P4 is electrically connected to the reference terminal Ref of the input buffer circuit. A drain of the fourth PMOS transistor P4 is used as the second output terminal of the second input subcircuit 31B. That is, the drain of the fourth PMOS transistor P4 is electrically connected to the second terminal of the second load subcircuit 32B. A source of the fourth PMOS transistor P4 is electrically connected to the source of the third PMOS transistor P3. That is, the source of the fourth PMOS transistor P4 is electrically connected to the second current source subcircuit 33B.

The second load subcircuit 32B includes a third NMOS transistor N3 and a fourth NMOS transistor N4. A gate of the third NMOS transistor N3 is used as the second terminal of the second load subcircuit 32B and is electrically connected to the second output terminal of the second input subcircuit 31B to receive the output signal from the second output terminal of the second input subcircuit 31B. As the first terminal of the second load subcircuit 32B, a drain of the third NMOS transistor N3 is electrically connected to the first output terminal of the second input subcircuit 31B and is used as the output terminal Output of the input buffer circuit. A source of the third NMOS transistor N3 is used as the control terminal of the second load subcircuit 32B and is electrically connected to the third external voltage. A gate and a drain of the fourth NMOS transistor N4 are both electrically connected to the gate of the third NMOS transistor N3, and a source of the fourth NMOS transistor N4 is electrically connected to the source of the third NMOS transistor N3.

The second current source subcircuit 33B is electrically connected to the control terminal of the second input subcircuit 31B and a fourth external voltage respectively, and the second current source subcircuit 33B is configured to provide the reference current to the second input buffer unit 30B. In this embodiment, the third external voltage is a grounding voltage, and the fourth external voltage is a power supply voltage.

The second compensation subcircuit 34B includes a first terminal and a second terminal, where the first terminal of the second compensation subcircuit 34B is electrically connected to the first input terminal of the second input subcircuit 31B, and the second terminal of the second compensation subcircuit 34B is electrically connected to the second terminal of the second load subcircuit 32B. The second compensation subcircuit 34B is configured to transmit the voltage variation of the input signal of the input terminal to the second load subcircuit 32B, to enlarge the amplitude of the effective output current of the input buffer circuit. In this embodiment, the second load subcircuit 34B includes a second capacitor C2.

In this embodiment, the sensitivity of the input buffer circuit is further improved by means of two input buffer units arranged in parallel.

Figure 6:
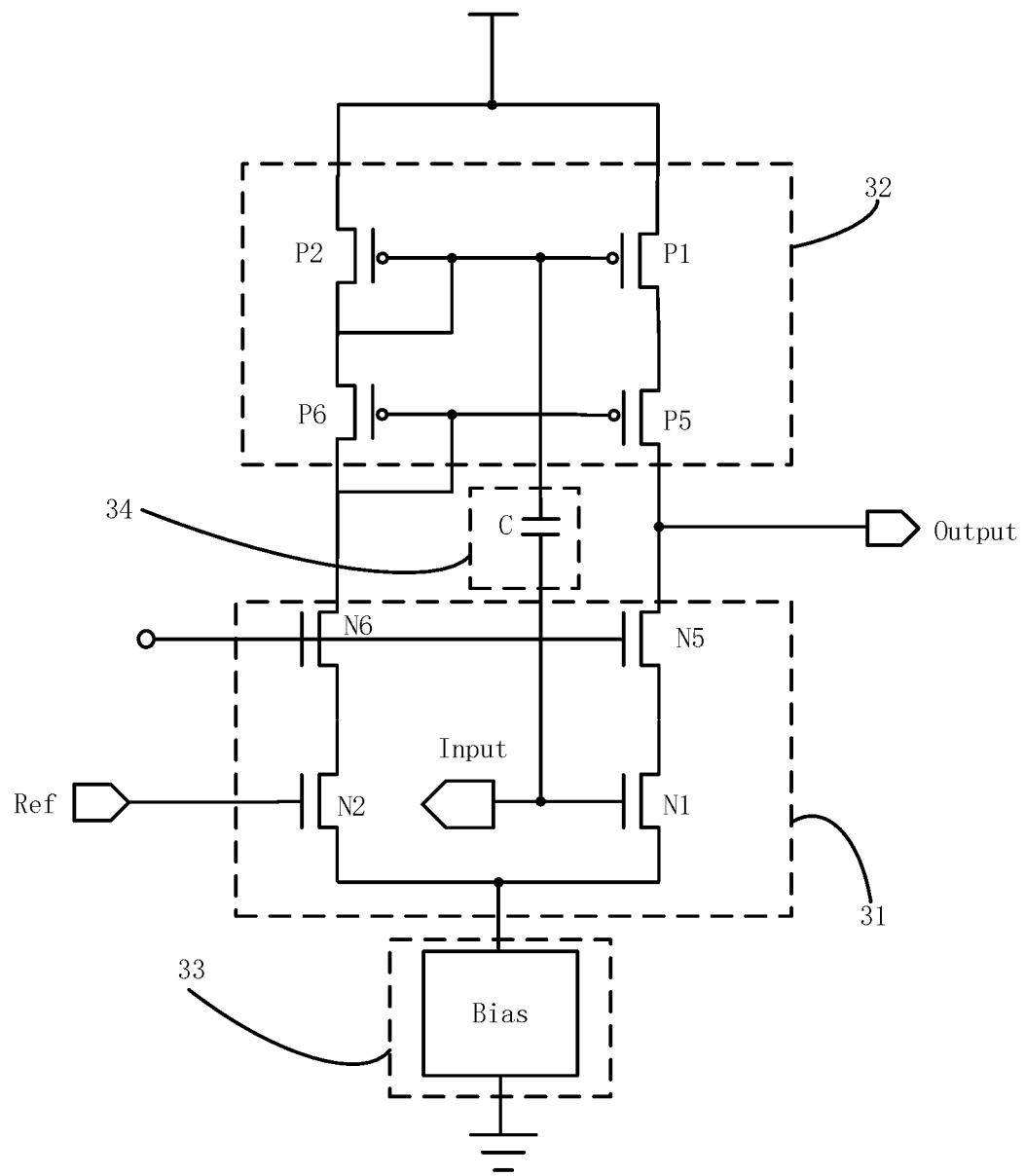
FIG. 6 is a circuit diagram of an input buffer circuit according to a fifth embodiment of the present disclosure.

The present disclosure also provides a fifth embodiment. FIG. 6 is a circuit diagram of an input buffer circuit according to the fifth embodiment of the present disclosure. Referring to FIG. 6, the input buffer circuit includes an input subcircuit 31, a load subcircuit 32, a current source subcircuit 33, and a compensation subcircuit 34.

The input subcircuit 31 includes a first NMOS transistor N1, a fifth NMOS transistor N5, a second NMOS transistor N2, and a sixth NMOS transistor N6. A gate of the first NMOS transistor N1 is used as the first input terminal of the input subcircuit 31. That is, the gate of the first NMOS transistor N1 is electrically connected to the input terminal Input of the input buffer circuit. A source of the first NMOS transistor N1 is used as the control terminal of the input subcircuit 31. That is, the source of the first NMOS transistor N1 is electrically connected to the current source subcircuit 33. A gate of the fifth NMOS transistor N5 is electrically connected to the third external voltage, a source of the fifth NMOS transistor N5 is electrically connected to a drain of the first NMOS transistor N1, and a drain of the fifth NMOS transistor N5 is used as the first output terminal of the input subcircuit 31. That is, the drain of the fifth NMOS transistor N5 is electrically connected to the output terminal Output of the input buffer circuit. A gate of the second NMOS transistor N2 is used as the second input terminal of the input subcircuit 31. That is, the gate of the second NMOS transistor N2 is electrically connected to the reference terminal Ref of the input buffer circuit. A source of the second NMOS transistor N2 is electrically connected to the source of the first NMOS transistor N1. That is, the source of the second NMOS transistor N2 is electrically connected to the current source subcircuit 33. A gate of the sixth NMOS transistor N6 is electrically connected to the third external voltage, a source of the sixth NMOS transistor N6 is electrically connected to a drain of the second NMOS transistor N2, and a drain of the sixth NMOS transistor N6 is used as the second output terminal of the input subcircuit 31. That is, the drain of the sixth NMOS transistor N6 is electrically connected to the second terminal of the load subcircuit 32. The third external voltage is provided to ensure that the fifth NMOS transistor N5 and the sixth NMOS transistor N6 operate in a saturation region.

Further, in this embodiment, the load subcircuit 32 includes a first PMOS transistor P1, a fifth PMOS transistor P5, a second PMOS transistor P2, and a sixth PMOS transistor P6.

A gate of the first PMOS transistor P1 is electrically connected to the second terminal of the compensation subcircuit 34, and a source of the first PMOS transistor P1 is used as the control terminal of the load subcircuit 32 and is electrically connected to the first external voltage. A gate of the fifth PMOS transistor P5 is electrically connected to the second output terminal of the input subcircuit 31 to receive the output signal from the second output terminal of the input subcircuit 31, and a source of the fifth PMOS transistor P5 is electrically connected to a drain of the first PMOS transistor P1. As the first terminal of the load subcircuit 32, a drain of the fifth PMOS transistor P5 is electrically connected to the first output terminal of the input subcircuit 31, and is used as the output terminal Output of the input buffer circuit. A gate and a drain of the second PMOS transistor P2 are both electrically connected to the gate of the first PMOS transistor P1, and a source of the second PMOS transistor P2 is electrically connected to the source of the first PMOS transistor P1. A gate and a drain of the sixth PMOS transistor P6 are both electrically connected to the gate of the fifth PMOS transistor P5. That is, the gate and the drain of the sixth PMOS transistor P6 are both electrically connected to the second output terminal of the input subcircuit 31 to receive the output signal from the second output terminal of the input subcircuit 31. A source of the sixth PMOS transistor P6 is electrically connected to the drain of the second PMOS transistor P2.

In this embodiment, the load subcircuit 32 comprises a plurality of PMOS transistors, and in other embodiments of the present disclosure, the load subcircuit 32 may also have the same structure as the load subcircuit 32 of the second embodiment. Structures of the current source subcircuit 33 and the compensation subcircuit 34 in this embodiment are the same as those in the second embodiment, and thus detailed descriptions thereof are omitted here.

Figure 7:
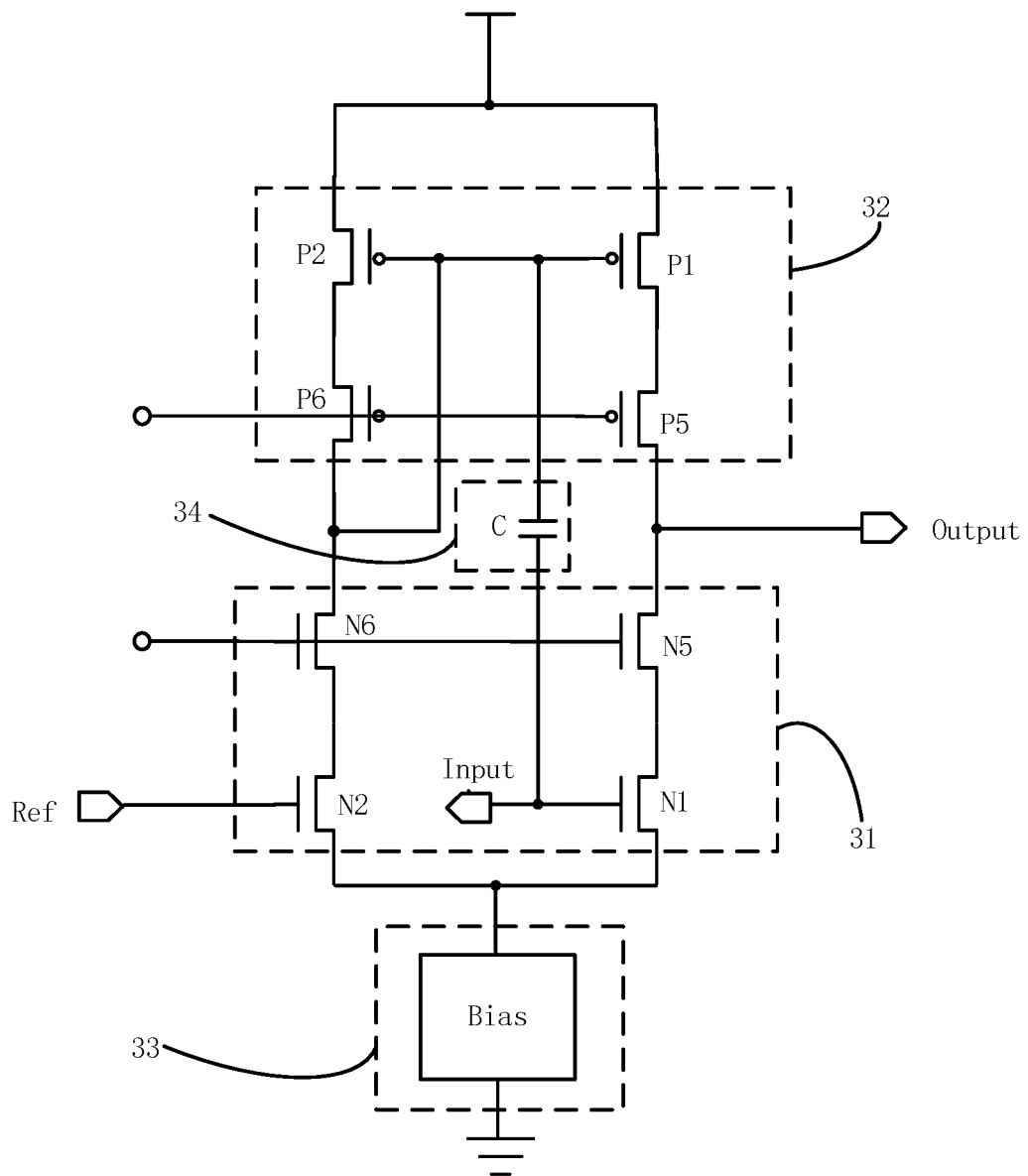
FIG. 7 is a circuit diagram of an input buffer circuit according to a sixth embodiment of the present disclosure.

The present disclosure also provides a sixth embodiment. The sixth embodiment is different from the fifth embodiment in that connection relationships between the plurality of POMS transistors of the load subcircuit 32 are different. In some embodiments, referring to FIG. 7, a circuit diagram of an input buffer circuit according to the sixth embodiment of the present disclosure is illustrated. In the sixth embodiment, the load subcircuit 32 includes a first PMOS transistor P1, a fifth PMOS transistor P5, a second PMOS transistor P2, and a sixth PMOS transistor P6.

A gate of the first PMOS transistor P1 is electrically connected to the second output terminal of the input subcircuit 31 and the second terminal of the compensation subcircuit 34, where the compensation subcircuit 34 is configured to transmit the voltage variation of the input terminal to the gate of the first PMOS transistor P1. A source of the first PMOS transistor P1 is used as the control terminal of the load subcircuit 32, and is electrically connected to the first external voltage. A gate of the fifth PMOS transistor P5 is electrically connected to the fourth external voltage, a source of the fifth PMOS transistor P5 is electrically connected to a drain of the first PMOS transistor P1, and as a first terminal of the load subcircuit 32, a drain of the fifth PMOS transistor P5 is electrically connected to the first output terminal of the input subcircuit 31, and is used as the output terminal Output of the input buffer circuit. A gate of the second PMOS transistor P2 is electrically connected to the gate of the first PMOS transistor P1, and a source of the second PMOS transistor P2 is electrically connected to the source of the first PMOS transistor P1. That is, the source of the second PMOS transistor P2 is electrically connected to the first external voltage. A gate of the sixth PMOS transistor P6 is electrically connected to the gate of the fifth PMOS transistor P5, a source of the sixth PMOS transistor P6 is electrically connected to a drain of the second PMOS transistor P2, and a drain of the sixth PMOS transistor P6 is electrically connected to the gate of the second PMOS transistor P2. The fourth external voltage is provided to ensure that the fifth PMOS transistor P5 and the sixth PMOS transistor P6 operate in the saturation region.

Further, when testing performance of the input buffer circuit, the input signal from the input terminal Input is generally fixed, the reference voltage of the reference terminal Ref is changed within a certain range, and the performance of the input buffer circuit is tested according to a detectable range of the reference voltage, and a concrete description is as follows.

Figure 8:
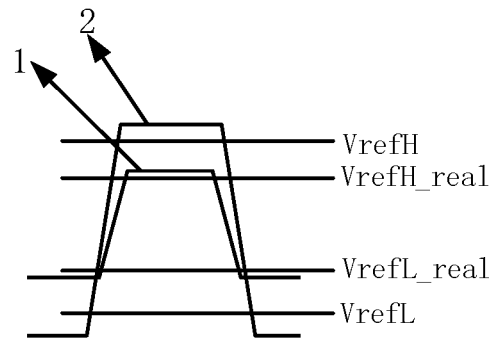
FIG. 8 is a waveform diagram of testing the input buffer circuit of the first embodiment and the input buffer circuit of the second embodiment in the present disclosure.

FIG. 8 is a waveform diagram of testing the input buffer circuit of the first embodiment and the input buffer circuit of the second embodiment in the present disclosure. Referring to FIG. 8, waveform 1 represents the input signal from the input terminal of the input buffer circuit obtained according to the first embodiment of the present disclosure, and waveform 2 represents an equivalent input signal from the input terminal of the input buffer circuit obtained according to the second embodiment of the present disclosure. Because the input buffer circuit obtained according to the second embodiment of the present disclosure is provided with the compensation subcircuit 34, amplitude of variation of the input voltage of the waveform 2 is greater than that of the input voltage of the waveform 1.

When the reference voltage fluctuates in the range of VrefH to VrefL, the input buffer circuit obtained according to the first embodiment of the present disclosure can detect the reference voltage in the range of VrefH_real to VrefL_real, and use the reference voltage as the corresponding output at the output terminal. However, when the reference voltage is VrefH_real or VrefL_real, which is only slightly smaller or greater than the input voltage, the input buffer circuit obtained according to the first embodiment of the present disclosure cannot detect the reference voltage, and the output terminal cannot make the corresponding output, which causes the output from the output terminal to be distorted: or when the reference voltage exceeds this range, for example, the reference voltage fluctuates between VrefH~VrefH_real and VrefL_real~VrefL, the input buffer circuit obtained according to the first embodiment of the present disclosure can neither detect the reference voltage nor make the corresponding output at the output terminal, causing the output from the output terminal to be distorted.

However, when using the input buffer circuit obtained according to the second embodiment of the present disclosure, the range of the equivalent input voltage of the input terminal increases. In this case, when the reference voltage is VrefH_real or VrefL_real, the difference between the reference voltage and the input voltage increases, the input buffer circuit can detect the reference voltage of VrefH_real or VrefL_real, and make the corresponding output at the output terminal: or when the reference voltage fluctuates between VrefH~VrefH_real and VrefL_real~VrefL, because the range of the equivalent input voltage of the input terminal increases, the input buffer circuit can still detect the reference voltage in this range, and make the corresponding output at the output terminal. That is, the input buffer circuit provided by the second embodiment of the present disclosure can detect the voltage in the range of VrefH~VrefL, and make the corresponding output at the output terminal. Therefore, the input buffer circuit provided by the second embodiment of the present disclosure can avoid distortion of the output signal from the output terminal, and thus the sensitivity of the input buffer circuit is improved.

The present disclosure also provides a semiconductor memory. The semiconductor memory adopts the above-mentioned input buffer circuit, and description of the structure of the input buffer circuit is not to be repeated. A controller of the semiconductor memory transmits the commands to the internal circuit by means of the input buffer circuit. Due to the existence of the compensation subcircuit, the input buffer circuit can transmit the voltage variation of the input terminal Input to the output terminal in time, such that the output terminal can respond to the voltage variation of the input terminal in time, thereby avoiding distortion of the output signal, improving the sensitivity of the input buffer circuit, and preventing negative effects from being caused to transmission of the commands inside the system.

The above merely are embodiments of the present disclosure. It is to be pointed out that to those of ordinary skill in the art, various improvements and embellishments may be made without departing from the principles of the present disclosure, and these improvements and embellishments are also deemed to be within the scope of protection of the present disclosure.

What is claimed is:

1. An input buffer circuit comprising an input terminal, an output terminal, a reference terminal and an input buffer unit, the input terminal being configured to receive an input signal, the output terminal being configured to output an output signal, the reference terminal being configured to receive a reference signal, the input buffer unit comprising:
   an input subcircuit comprising a first input terminal, a second input terminal, a first output terminal, a second output terminal and a control terminal, the first input terminal being used as the input terminal of the input buffer circuit, and the second input terminal being used as the reference terminal of the input buffer circuit;
   a load subcircuit comprising a first terminal, a second terminal and a control terminal, the first terminal being electrically connected to the first output terminal of the input subcircuit and being used as the output terminal of the input buffer circuit, the second terminal being electrically connected to the second output terminal of the input subcircuit, and the control terminal being electrically connected to a first external voltage;
   a current source subcircuit electrically connected to the control terminal of the input subcircuit and a second external voltage respectively, the current source subcircuit being configured to provide a reference current to the input buffer circuit; and
   a compensation subcircuit comprising a first terminal and a second terminal, the first terminal of the compensation subcircuit being electrically connected to the first input terminal of the input subcircuit, the second terminal of the compensation subcircuit being electrically connected to the second terminal of the load subcircuit, the compensation subcircuit being configured to transmit a voltage variation of the input signal to the load subcircuit to enlarge a magnitude of an effective output current of the input buffer circuit; and,
   wherein the input subcircuit comprises: a third PMOS transistor, a gate of the third PMOS transistor being used as the first input terminal of the input subcircuit, a drain of the third PMOS transistor being used as the first output terminal of the input subcircuit, and a source of the third PMOS transistor being used as the control terminal of the input subcircuit; and
   a fourth PMOS transistor, a gate of the fourth PMOS transistor being used as the second input terminal of the input subcircuit, a drain of the fourth PMOS transistor being used as the second output terminal of the input subcircuit, and a source of the fourth PMOS transistor being electrically connected to the source of the third PMOS transistor.

2. The input buffer circuit according to claim 1, wherein the load subcircuit comprises:
   a third NMOS transistor, a gate of the third NMOS transistor being used as the second terminal of the load subcircuit, a drain of the third NMOS transistor being used as the first terminal of the load subcircuit, and a source of the third NMOS transistor being used as the control terminal of the load subcircuit; and
   a fourth NMOS transistor, a gate and a drain of the fourth NMOS transistor being both electrically connected to the gate of the third NMOS transistor, and a source of the fourth NMOS transistor being electrically connected to the source of the third NMOS transistor.

3. The input buffer circuit according to claim 2, wherein the first external voltage is a grounding voltage, the second external voltage being a power supply voltage.

4. The input buffer circuit according to claim 1, wherein the compensation subcircuit comprises a capacitor.

5. An input buffer circuit comprising an input terminal, an output terminal, a reference terminal and an input buffer unit, the input terminal being configured to receive an input signal, the output terminal being configured to output an output signal, the reference terminal being configured to receive a reference signal, the input buffer unit comprising:
   an input subcircuit comprising a first input terminal, a second input terminal, a first output terminal, a second output terminal and a control terminal, the first input terminal being used as the input terminal of the input buffer circuit, and the second input terminal being used as the reference terminal of the input buffer circuit;
   a load subcircuit comprising a first terminal, a second terminal and a control terminal, the first terminal being electrically connected to the first output terminal of the input subcircuit and being used as the output terminal of the input buffer circuit, the second terminal being electrically connected to the second output terminal of the input subcircuit, and the control terminal being electrically connected to a first external voltage;
   a current source subcircuit electrically connected to the control terminal of the input subcircuit and a second external voltage respectively, the current source subcircuit being configured to provide a reference current to the input buffer circuit; and
   a compensation subcircuit comprising a first terminal and a second terminal, the first terminal of the compensation subcircuit being electrically connected to the first input terminal of the input subcircuit, the second terminal of the compensation subcircuit being electrically connected to the second terminal of the load subcircuit, the compensation subcircuit being configured to transmit a voltage variation of the input signal to the load subcircuit to enlarge a magnitude of an effective output current of the input buffer circuit; and,
   wherein the input buffer circuit comprises two of the input buffer units, respectively denoted as a first input buffer unit and a second input buffer unit, the first input buffer unit and the second input buffer unit being arranged in parallel;

wherein the first input buffer unit comprises:

a first input subcircuit comprising a first NMOS transistor and a second NMOS transistor, a gate of the first NMOS transistor being used as a first input terminal of the first input subcircuit, a drain of the first NMOS transistor being used as a first output terminal of the first input subcircuit, a source of the first NMOS transistor being used as a control terminal of the first input subcircuit, a gate of the second NMOS transistor being used as a second input terminal of the first input subcircuit, a drain of the second NMOS transistor being used as a second output terminal of the first input subcircuit, and a source of the second NMOS transistor being electrically connected to the source of the first NMOS transistor;

a first load subcircuit comprising a first PMOS transistor and a second PMOS transistor, a gate of the first PMOS transistor being used as a second terminal of the first load subcircuit, a drain of the first PMOS transistor being used as a first terminal of the first load subcircuit, a source of the first PMOS transistor being used as a control terminal of the first load subcircuit electrically connected to the first external voltage, a gate and a drain of the second PMOS transistor being both electrically connected to the gate of the first PMOS transistor, and a source of the second PMOS transistor being electrically connected to the source of the first PMOS transistor;

a first current source subcircuit electrically connected to the control terminal of the first input subcircuit and the second external voltage respectively, the first current source subcircuit being configured to provide the reference current to the first input buffer unit; and a first compensation subcircuit comprising a first terminal and a second terminal, the first terminal of the first compensation subcircuit being electrically connected to the first input terminal of the first input subcircuit, the second terminal of the first compensation subcircuit being electrically connected to the second terminal of the first load subcircuit, the first compensation subcircuit being configured to transmit the voltage variation of the input signal to the first load subcircuit to enlarge the magnitude of the effective output current of the input buffer circuit.

6. The input buffer circuit according to claim 5, wherein the second input buffer unit comprises:

a second input subcircuit comprising a third PMOS transistor and a fourth PMOS transistor, a gate of the third PMOS transistor being used as a first input terminal of the second input subcircuit, a drain of the third PMOS transistor being used as a first output terminal of the second input subcircuit, a source of the third PMOS transistor being used as a control terminal of the second input subcircuit, a gate of the fourth PMOS transistor being used as a second input terminal of the second input subcircuit, a drain of the fourth PMOS transistor being used as a second output terminal of the second input subcircuit, and a source of the fourth PMOS transistor being electrically connected to the source of the third PMOS transistor;

a second load subcircuit comprising a third NMOS transistor and a fourth NMOS transistor, a gate of the third NMOS transistor being used as a second terminal of the second load subcircuit, a drain of the third NMOS transistor being used as a first terminal of the second load subcircuit, a source of the third NMOS transistor being used as a control terminal of the second load subcircuit electrically connected to a third external voltage, a gate and a drain of the fourth NMOS transistor being both electrically connected to the gate of the third NMOS transistor, and a source of the fourth NMOS transistor being electrically connected to the source of the third NMOS transistor;

a second current source subcircuit electrically connected to the control terminal of the second input subcircuit and a fourth external voltage respectively, the second current source subcircuit being configured to provide the reference current to the second input buffer unit; and a second compensation subcircuit comprising a first terminal and a second terminal, the first terminal of the second compensation subcircuit being electrically connected to the first input terminal of the second input subcircuit, the second terminal of the second compensation subcircuit being electrically connected to the second terminal of the second load subcircuit, and the second compensation subcircuit being configured to transmit the voltage variation of the input signal of the input terminal to the second load subcircuit, to enlarge the amplitude of the effective output current of the input buffer circuit.

7. The input buffer circuit according to claim 6, wherein the first compensation subcircuit comprises a first capacitor, the second compensation subcircuit comprising a second capacitor.

8. The input buffer circuit according to claim 6, wherein the first external voltage and the fourth external voltage are power supply voltages, the second external voltage and the third external voltage being grounding voltages.

9. An input buffer circuit comprising an input terminal, an output terminal, a reference terminal and an input buffer unit, the input terminal being configured to receive an input signal, the output terminal being configured to output an output signal, the reference terminal being configured to receive a reference signal, the input buffer unit comprising:

an input subcircuit comprising a first input terminal, a second input terminal, a first output terminal, a second output terminal and a control terminal, the first input terminal being used as the input terminal of the input buffer circuit, and the second input terminal being used as the reference terminal of the input buffer circuit;

a load subcircuit comprising a first terminal, a second terminal and a control terminal, the first terminal being electrically connected to the first output terminal of the input subcircuit and being used as the output terminal of the input buffer circuit, the second terminal being electrically connected to the second output terminal of the input subcircuit, and the control terminal being electrically connected to a first external voltage;

a current source subcircuit electrically connected to the control terminal of the input subcircuit and a second external voltage respectively, the current source subcircuit being configured to provide a reference current to the input buffer circuit; and a compensation subcircuit comprising a first terminal and a second terminal, the first terminal of the compensation subcircuit being electrically connected to the first input terminal of the input subcircuit, the second terminal of the compensation subcircuit being electrically connected to the second terminal of the load subcircuit, the compensation subcircuit being configured to transmit a voltage variation of the input signal to the load subcircuit to enlarge a magnitude of an effective output current of the input buffer circuit; and, wherein the input subcircuit comprises: a first NMOS transistor, a gate of the first NMOS transistor being used as the first input terminal of the input subcircuit, and a source of the first NMOS transistor being used as the control terminal of the input subcircuit;

a fifth NMOS transistor, a gate of the fifth NMOS transistor being electrically connected to a third external voltage, a source of the fifth NMOS transistor being electrically connected to a drain of the first NMOS transistor, and a drain of the fifth NMOS transistor being used as the first output terminal of the input subcircuit;

a second NMOS transistor, a gate of the second NMOS transistor being used as the second input terminal of the input subcircuit, and a source of the second NMOS transistor being electrically connected to the source of the first NMOS transistor; and a sixth NMOS transistor, a gate of the sixth NMOS transistor being electrically connected to the third external voltage, a source of the sixth NMOS transistor being electrically connected to a drain of the second NMOS transistor, and a drain of the sixth NMOS transistor being used as the second output terminal of the input subcircuit.

10. The input buffer circuit according to claim 9, wherein the load subcircuit comprises: a first PMOS transistor, a gate of the first PMOS transistor being electrically connected to the second terminal of the compensation subcircuit, and a source of the first PMOS transistor being used as the control terminal of the load subcircuit;

a fifth PMOS transistor, a gate of the fifth PMOS transistor being electrically connected to the second output terminal of the input subcircuit, a source of the fifth PMOS transistor being electrically connected to a drain of the first PMOS transistor, and a drain of the fifth PMOS transistor being used as the first terminal of the load subcircuit;

a second PMOS transistor, a gate and a drain of the second PMOS transistor being both electrically connected to the gate of the first PMOS transistor, and a source of the second PMOS transistor being electrically connected to the source of the first PMOS transistor; and a sixth PMOS transistor, a gate and a drain of the sixth PMOS transistor being both electrically connected to the gate of the fifth PMOS transistor, and a source of the sixth PMOS transistor being electrically connected to the drain of the second PMOS transistor.

11. The input buffer circuit according to claim 9, wherein the load subcircuit comprises: a first PMOS transistor, a gate of the first PMOS transistor being connected to the second output terminal of the input subcircuit and the second terminal of the compensation subcircuit, and a source of the first PMOS transistor being used as the control terminal of the load subcircuit;

a fifth PMOS transistor, a gate of the fifth PMOS transistor being electrically connected to a fourth external voltage, a source of the fifth PMOS transistor being electrically connected to a drain of the first PMOS transistor, and a drain of the fifth PMOS transistor being used as the first terminal of the load subcircuit;

a second PMOS transistor, a gate of the second PMOS transistor being electrically connected to the gate of the first PMOS transistor, and a source of the second PMOS transistor being electrically connected to the source of the first PMOS transistor; and a sixth PMOS transistor, a gate of the sixth PMOS transistor being electrically connected to the gate of the fifth PMOS transistor, a source of the sixth PMOS transistor being electrically connected to a drain of the second PMOS transistor, and a drain of the sixth PMOS transistor being electrically connected to the gate of the second PMOS transistor.

* * * * *